United States Patent [19]
Kim et al.

[11] Patent Number: 5,612,853
[45] Date of Patent: Mar. 18, 1997

[54] PACKAGE FOR A POWER SEMICONDUCTOR DEVICE

[75] Inventors: Dong-Goo Kim; Min-Kyu Song; Seong-Su Park; Seung-Goo Kang; Hyung-Jin Yoon; Hyung-Moo Park, all of Daejeon, Rep. of Korea

[73] Assignee: Electronics and Telecommunications Research Institute, Daejeon-Shi, Rep. of Korea

[21] Appl. No.: 381,304

[22] Filed: Jan. 31, 1995

Related U.S. Application Data

[62] Division of Ser. No. 268,104, Jul. 6, 1994, Pat. No. 5,446,959.

[30] Foreign Application Priority Data

Jul. 12, 1993 [KR] Rep. of Korea ............... 93-13085

[51] Int. Cl.$^6$ ........................................ H05K 7/20
[52] U.S. Cl. ................................. 361/723; 257/675
[58] Field of Search ........................ 174/16.3, 250, 174/35 R; 257/669, 675, 677, 706–707, 712–723, 722, 747; 333/32; 361/704, 707, 717, 718, 722, 723, 818

[56] References Cited

U.S. PATENT DOCUMENTS

| | | |
|---|---|---|
| 4,079,511 | 3/1978 | Grabbe . |
| 4,493,143 | 1/1985 | Maier . |
| 4,783,428 | 11/1988 | Kalfus . |
| 4,811,166 | 3/1989 | Alvarez et al. ............... 361/717 |
| 4,829,403 | 5/1989 | Harding . |
| 4,855,868 | 8/1989 | Harding . |
| 5,079,618 | 1/1992 | Farnworth ..................... 257/713 |
| 5,134,463 | 7/1992 | Yamaguchi ................... 257/677 |
| 5,270,262 | 12/1993 | Switky et al. . |
| 5,298,684 | 3/1994 | Leeb . |
| 5,362,680 | 3/1994 | Heinen et al. . |
| 5,442,234 | 8/1995 | Cians ............................... 257/675 |

*Primary Examiner*—Gregory D. Thompson
*Attorney, Agent, or Firm*—Larson and Taylor

[57] ABSTRACT

A package for a power semiconductor device is made using the method comprising the steps of preparing a lead frame including a blade or paddle for providing a semiconductor chip on a top surface thereof, tie bars for supporting said paddle, wherein said paddle being provided lower in horizontal surface than the leads; attaching a heat radiating plate on a bottom surface of the paddle by cladding; attaching a Kovar plate on the top surface of the paddle by soldering, said Kovar plate having similar heat expansion coefficient to that of the chip; providing the chip on the Kovar plate by soldering; wire-bonding terminals of said semiconductor chip to the corresponding leads of the lead frame, respectively; coating polyimide over the semiconductor chip by spin-coating; curing the polyimide coated thus; forming a metal cap above the said paddle by soldering, and injecting a molding material into a molder for enclosing the paddle and curing the molding material injected thus. The method can be applied to produce a plastic package of a power semiconductor device at low cost. The metal cap is grounded through the tie bars as a source electrode to shield a noise.

3 Claims, 3 Drawing Sheets

PACKAGE FOR A POWER SEMICONDUCTOR DEVICE

This is a division of application Ser. No. 08/268,104 filed Jul. 6, 1994 now U.S. Pat. No. 5,446,959.

BACKGROUND OF THE INVENTION

The present invention relates to a plastic package for accommodating a semiconductor integrated circuit device, more particularly to plastic package for a power semiconductor device using a lead frame.

In many of power semiconductor device packages produced by several conventional packaging methods, a power semiconductor chip having low power consumption of 0.5 Watt of less is packaged in a plastic base, and another power semiconductor chip having relatively high power consumption of 0.5 Watt or more is packaged using a ceramic base, a metal frame, and the like, so as to dissipate heat created while operating.

Such a plastic package in which a power semiconductor device is packaged has some disadvantages that the interface between the semiconductor device and a sealing material is peeled off and that the device is frequently cracked by the difference in thermal expansion coefficient between the semiconductor chip and the sealing material. Furthermore, in this plastic package, there arises a drawback that the power semiconductor chip is deteriorated in its high frequency characteristics because of the above-described disadvantages.

In order to improve high frequency characteristics of a power semiconductor chip in a ceramic package, it is required to deposit metal as castellation of a ceramic member and to use a metal lid electrically connected to a ground metal via, so that noise generated in the package may be shielded by metal castellation and ground via. Thus, the processes for packaging a power semiconductor device are complicated and result in high cost required for packaging.

Furthermore, this conventional ceramic package has a resonance of a high frequency signal, so that high frequency characteristics, such as power gain and noise figure value are deteriorated.

In order to remove resonance of a high frequency signal generated in the conventional ceramic package, a metal frame type package has been recently developed. Such a metal frame type package has an improved high frequency characteristics, but has a drawback of difficulty in packaging.

Also, since characteristics of a power semiconductor device is significantly dependent upon a power gain and a noise factor, a multi-layer ceramic type package has been positively studied in consideration of an impedance matching so as to improve a high frequency characteristics of a power semiconductor device therein.

SUMMARY OF THE INVENTION

It is an object of the present invention to provide a package and method of packaging a power semiconductor device that overcomes the above disadvantages.

It is a further object of the present invention to provide a package for a power semiconductor device in which a high frequency property thereof is improved.

It is another object of the present invention to provide a package for a power semiconductor device which is suitable for a mass production at a low manufacturing cost.

To achieve the above-mentioned objects, a package for a power semiconductor device according to one aspect of the present invention is made by a method that comprises the steps of preparing a lead frame including a blade or paddle for providing a semiconductor chip on a top surface thereof, a gate electrode lead, a drain electrode lead and tie bars for supporting said paddle, wherein said paddle being provided lower in horizontal surface than the gate electrode or the drain electrode lead; attaching a heat radiating plate on a bottom surface of the paddle by cladding; attaching a Kovar plate on the top surface of the paddle by soldering, said Kovar plate having similar heat expansion coefficient to that of the semiconductor chip, so as to remove a stress caused due to a difference in heat expansion coefficient between the chip and the lead frame; providing the semiconductor chip on the Kovar plate by soldering; wire-bonding terminals of said semiconductor chip to the corresponding leads of the lead frame, respectively; coating polyimide over the semiconductor chip by spin-coating; curing the polyimide coated thus; forming a metal cap above the said paddle by soldering so as to cover the semiconductor chip by the metal cap formed thus, and injecting a molding material into a molder for enclosing the paddle and curing the molding material injected thus.

In this embodiment, the step of attaching said Kovar plate is performed using an alloy including Pb, In and Ag in the ratio of 92.5:5:2.5 in the range of 310° to 320° C. in temperature.

In this embodiment, the step of coating and curing said polyimide is performed in a spin speed of 3000 rpm and at a curing temperature of 220° C. so as to have thickness of 5 μm.

In this embodiment, the step of forming said metal cap is performed using an alloy including Sn and Sb in the ratio of 95:5 in the range of 240° to 250° C. in temperature.

In this embodiment, said semiconductor chip is a power transistor.

The package for accommodating a power semiconductor chip according to another aspect of the present invention comprises a lead frame on which a power semiconductor chip is provided, said lead frame including a body, a blade or paddle on which the power semiconductor chip is located, each of tie bars connected to both of the body and the paddle and arranged at opposite sides of the paddle to support the paddle, said tie bars being impedance-matched, a drain electrode lead connected to one side of the body, and a gate electrode lead arranged at opposite side of the drain electrode lead; a heat radiating plate attached to a bottom surface of the paddle; a Kovar plate formed between the paddle and the power semiconductor device, said Kovar plate having similar thermal expansion coefficient to that of the semiconductor chip; a polyimide layer having a predetermined thickness formed over the semiconductor chip; a metal cap provided above the polyimide and electrically connected to the tie bars by soldering; and an epoxy resin layer deposited on the metal cap by molding, wherein said semiconductor chip being electrically connected with the Kovar plate by soldering, and respective terminals of the semiconductor chip being electrically connected to corresponding leads of the lead frame by wire-bonding.

In this embodiment, the tie bars is used as a source electrode lead of the lead frame.

In this embodiment, said semiconductor chip is a power transistor, and a source electrode of the power transistor is grounded through the tie bars.

BRIEF DESCRIPTION OF THE DRAWINGS

This invention may be better understood and its object will become apparent to those skilled in the art by reference to the accompanying drawings as follows.

DETAILED DESCRIPTION OF THE PREFERRED EMBODIMENT

Figure 1:
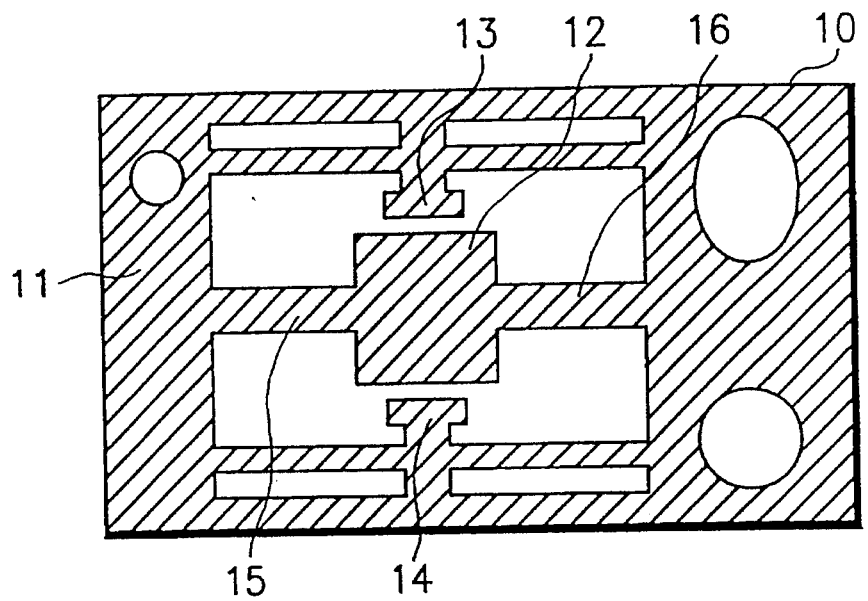
FIG. 1 is a plan view showing a lead frame of a package according to the present invention.

Referring to FIG. 1, a lead frame 10 included in the package according to the present invention comprises a body 11, a blade or paddle 12 on which a power semiconductor chip (not shown) is located, two tie bars 15, 16 each connected to both of the body 11 and the paddle 12 and arranged at both ends of the paddle 12 to support the paddle, a drain electrode lead 14 connected to one side of the body 11, and a gate electrode lead 13 arranged at opposite side of the one side and connected to the body 11. The two tie bars 15, 16 serve as a source electrode lead of the lead frame 10. In this embodiment, in consideration of an impedance matching between the power semiconductor device and the lead frame, these leads 13, 14, 15 and 16 are manufactured by pressing. Also, the paddle 12 is provided lower to the extent in horizontal surface than the gate electrode lead 13 and the drain electrode lead 14.

Thereinafter, the steps of packaging a power semiconductor device will be described with reference to FIGS. 2A to 2G.

Figure 2A:
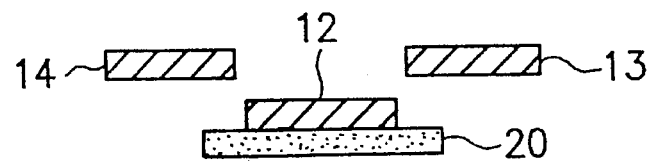
FIGS. 2A to 2G are cross-sectional views showing the steps of manufacturing a package according to the present invention.

In FIG. 2A, it is shown that the paddle 12 is sunk under the horizontal surface of each of the gate and drain electrode leads 13, 14. On the bottom surface of the sunk paddle 12, a heat radiating plate 20 is attached using a cladding process. The heat radiating plate 20 is preferably composed of copper(Cu).

Figure 2B:
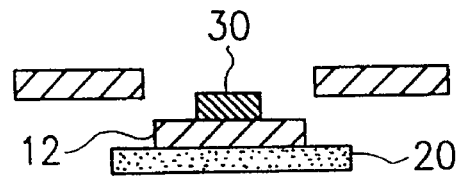

With reference to FIG. 2B, on the top surface of the paddle 12 a Kovar plate 30 is attached using a soldering process as well-known in the art. The Kovar plate 30 has a similar thermal expansion coefficient to that of a power semiconductor chip 40 to be provided thereon, and thus presence of a stress due to the difference in thermal expansion coefficient between the semiconductor chip 40 and the lead frame may be prevented. In this embodiment, the above step is performed in the range of 290° to 310° C. in temperature. An alloy used in the soldering process contains Pb, In and Ag in the ratio of 92.5:5:2.5.

Figure 2C:
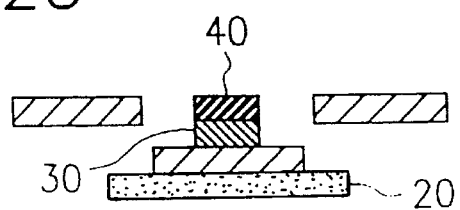

Thereafter, as shown in FIG. 2C, a die bonding process is performed. In FIG. 2C, the semiconductor chip 40 is formed on the Kovar plate 30 using the soldering process. A GaAs power MESFET (Metal Semiconductor Field Effect Transistor) chip is used as the semiconductor chip 40 in this embodiment. Preferably, this die boding step is performed in the range of 280° to 290° C. in temperature, and the die bonding material is an alloy containing Au and Sn in the ratio of 80:20.

Figure 2D:
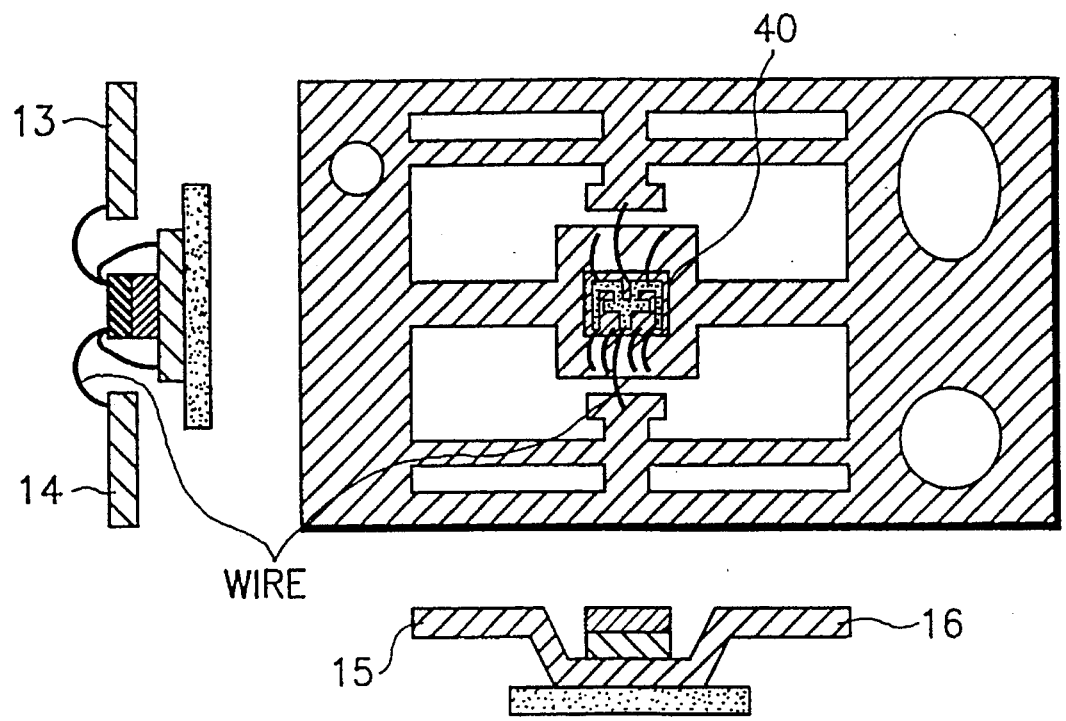

Subsequently, a wire bonding process is performed as shown in FIG. 2D. In details, using a well-known wire bonding process in the art, first, second and third electrodes of the semiconductor chip 40 are electrically connected to the gate electrode lead 13, the drain electrode lead 14 and the source electrode lead 15, 16 of the lead frame 10, respectively. The third electrode of the semiconductor chip 40 is electrically connected to the body 11 through one of the source electrode leads 15, 16 to be grounded. In this embodiment, if the semiconductor chip 40 is formed of a power transistor, the first to third electrodes of the semiconductor chip 40 correspond to gate, drain and source electrodes of the power transistor, respectively.

After performing the above wire bonding process, over the semiconductor chip 40 a pre-imidized polyimide (shown at 45 in FIG. 2E) is deposited by a spin coating process and then cured. As a result, a reaction between the semiconductor chip 40 and a molding material to be molded later is prevented, and thus the semiconductor chip 40 can be significantly improved in a high frequency property thereof. This depositing process is carried out in a spin speed of 3000 rpm at a temperature of 220° C., so that the polyimide layer has 5 μm in thickness.

Figure 2E:
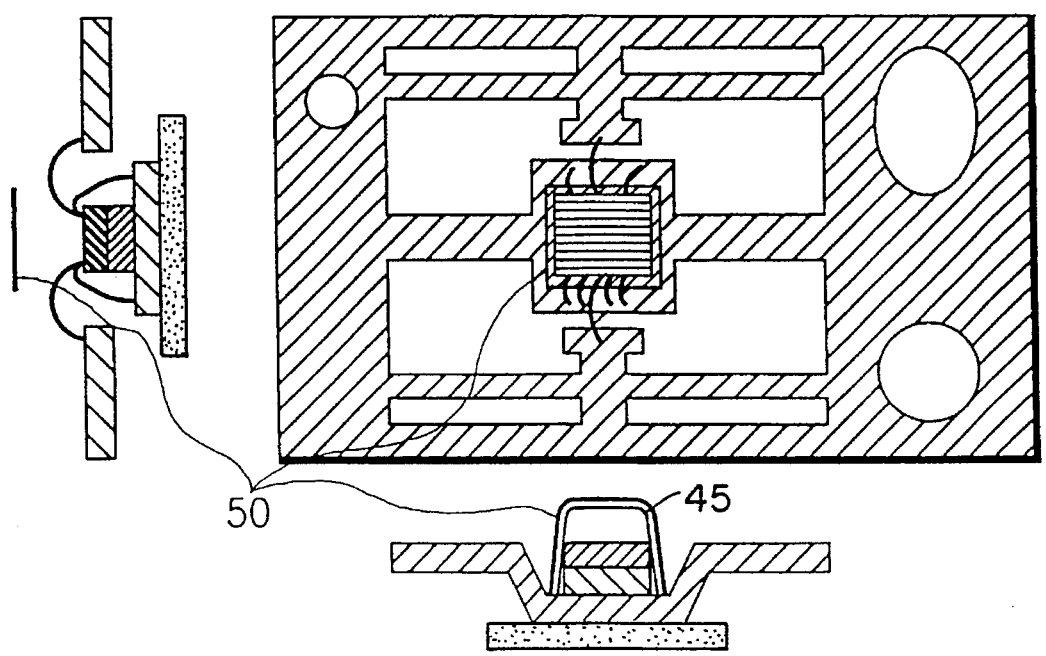

Also, above the top surface of the semiconductor chip 40 a metal cap 50 is provided covering all exposed surfaces of the Kovar plate 30, and is fixed to the paddle 12 by soldering, as shown in FIG. 2E. This process is carried out in the range of 240° to 250° C. in temperature. For soldering, an alloy containing Sn and Sb in the ratio of 95:5 is used. As described above, the metal cap 50 is electrically connected to the source electrode lead 15 or 16 to be grounded, thereby improving substantially the high frequency property of the semiconductor chip 40. This is because the lead frame 10, gate 13, drain 14 and source electrode 15, 16 are provided in consideration of an impedance matching.

Figure 2F:
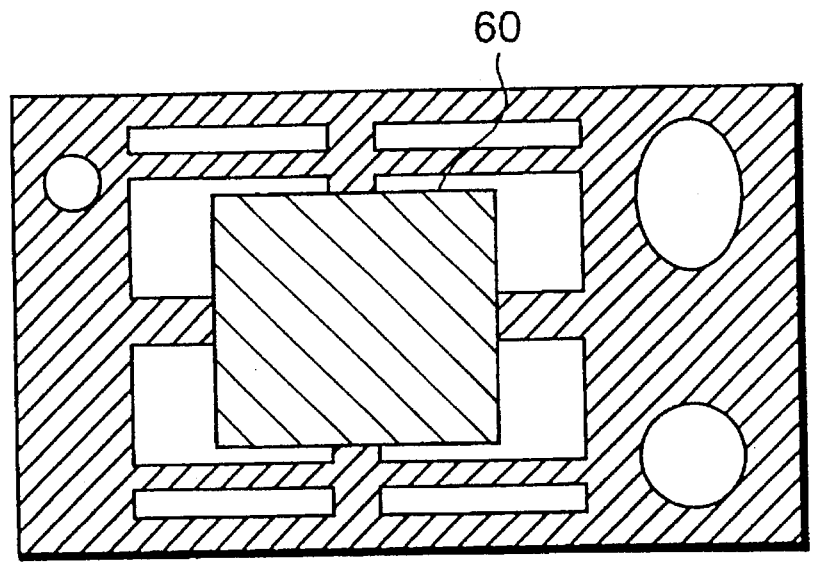
Figure 2G:
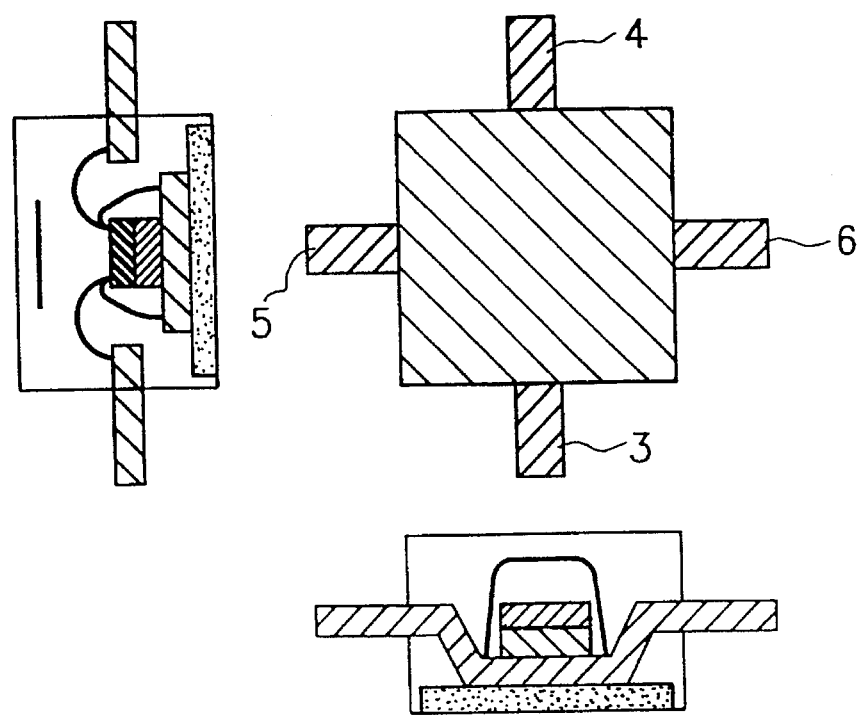

Finally, a plastic molding and curing process is performed as shown in FIG. 2F. In this process, an epoxy resin as a molding material is injected into a molder using a well-known molding method in the art and then is cured in the range of 175° to 200° C. in temperature. As a result, fabrication of the package for accommodating the power semiconductor device is completed.

According to the present invention, since the plastic package produced by the packaging method can be manufactured by a plastic molding process and an impedance matching is considered when a lead frame is provided, the packaging method of the present invention is possible to use conventional plastic packaging processes.

Furthermore, the plastic package according to the present can be largely lowered in the cost of production thereof as compared to that in a conventional ceramic packaging method.

Additionally, according to the present invention a metal cap grounded through a source electrode lead in the package can shield a noise created in the package, and thus the power semiconductor device can be enhanced in a high frequency characteristics thereof.

In addition, since in the packaging method according to the present invention a depositing process of polyimide is performed after performing a wire bonding process, the plastic package produced thus is improved in reliability and the processes are simplified.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A package for accommodating a power semiconductor device comprising;

a lead frame on which a power semiconductor chip is provided, said lead frame including a body, a paddle on which the power semiconductor chip is located, tie bars connected to both of the body and the paddle and arranged at opposite sides of the paddle to support the paddle, a drain electrode lead connected to one side of the body, and a gate electrode lead arranged at opposite side of the drain electrode lead and connected to the body;

a heat radiating plate attached to a bottom surface of the paddle;

a Kovar plate formed on the paddle, said Kovar plate having similar thermal expansion coefficient to that of the semiconductor chip;

a polyimide layer having a predetermined thickness formed over the semiconductor chip;

a metal cap provided above the paddle and electrically connected to the tie bars by soldering; and an epoxy resin layer deposited on the metal cap by molding, wherein said semiconductor chip being electrically connected with the Kovar plate by soldering, and respective terminals of the semiconductor chip being electrically connected to corresponding leads of the lead frame by wire-bonding, and wherein the paddle is provided lower in horizontal surface than the gate electrode lead.

2. The package according to claim 1, wherein the tie bars are impedance-matched as a source electrode lead of the lead frame.

3. The package according to claim 2, wherein a source electrode of the semiconductor chip is grounded through the tie bars to serve as the source electrode lead.

* * * * *